United States Patent [19]

Melrose et al.

[11] Patent Number: 4,972,444
[45] Date of Patent: Nov. 20, 1990

[54] DIGITAL PHASE-LOCKED DEVICE AND METHOD

[75] Inventors: Caryn G. Melrose; Joe D. Rose, both of San Jose, Calif.

[73] Assignee: International Business Machines Corporation, Armonk, N.Y.

[21] Appl. No.: 219,074

[22] Filed: Jul. 14, 1988

[51] Int. Cl.$^5$ .............................................. H03D 3/24
[52] U.S. Cl. ........................................ 375/120; 328/72; 375/119
[58] Field of Search ................. 375/106, 112, 114, 113, 375/116, 119, 120; 360/44, 51; 328/63, 72; 307/269, 480; 331/1 R, 25

[56] References Cited

U.S. PATENT DOCUMENTS

| | | | |
|---|---|---|---|
| 4,357,707 | 11/1982 | DeLury | 375/110 |
| 4,359,770 | 11/1982 | Suzuka | 375/119 |
| 4,472,686 | 9/1984 | Nishimura et al. | 375/120 |
| 4,620,300 | 10/1986 | Ogawa | 375/106 |
| 4,651,026 | 3/1987 | Sereaty et al. | 375/120 |
| 4,677,648 | 6/1987 | Zurfluh | 375/120 |

Primary Examiner—Bendict V. Safourek
Assistant Examiner—Stephen Chin
Attorney, Agent, or Firm—Henry E. Otto, Jr.

[57] ABSTRACT

An improved digital phase-locked device and method for synchronizing incoming data (8) with a local clock (24) includes registers (12a,12b) which, when alternately triggered during each successive selection cycle, trap the states of waveforms supplied by a delay element string (11). A transition detector (13) detects transitions in these waveforms and provides to a selection means (17, 18, 19) a plurality of outputs, each corresponding directly to a respective clock position. Registers 19a, 19b of the selection register are alternately triggered by clock signals. Selection register 19 provides a window (SW) defining the maximum number of unique clock positions adjacent a then present clock position within which bit patterns are examined for determining whether any of the clock positions then within the window constitutes a valid local clock selection choice. While in a locked mode, if a bit pattern within window (SW) denotes only one local clock selection choice, that clock position is selected and locked as the local clock. If the bit pattern in window (SW) denotes none or more than one local clock selection choice, then unlocking is deferred until at least the next selection cycle. If during the deferral period, the bit pattern denotes only one clock selection choice, that clock position will be selected and locked as the local clock; otherwise unlocking will occur.

16 Claims, 3 Drawing Sheets

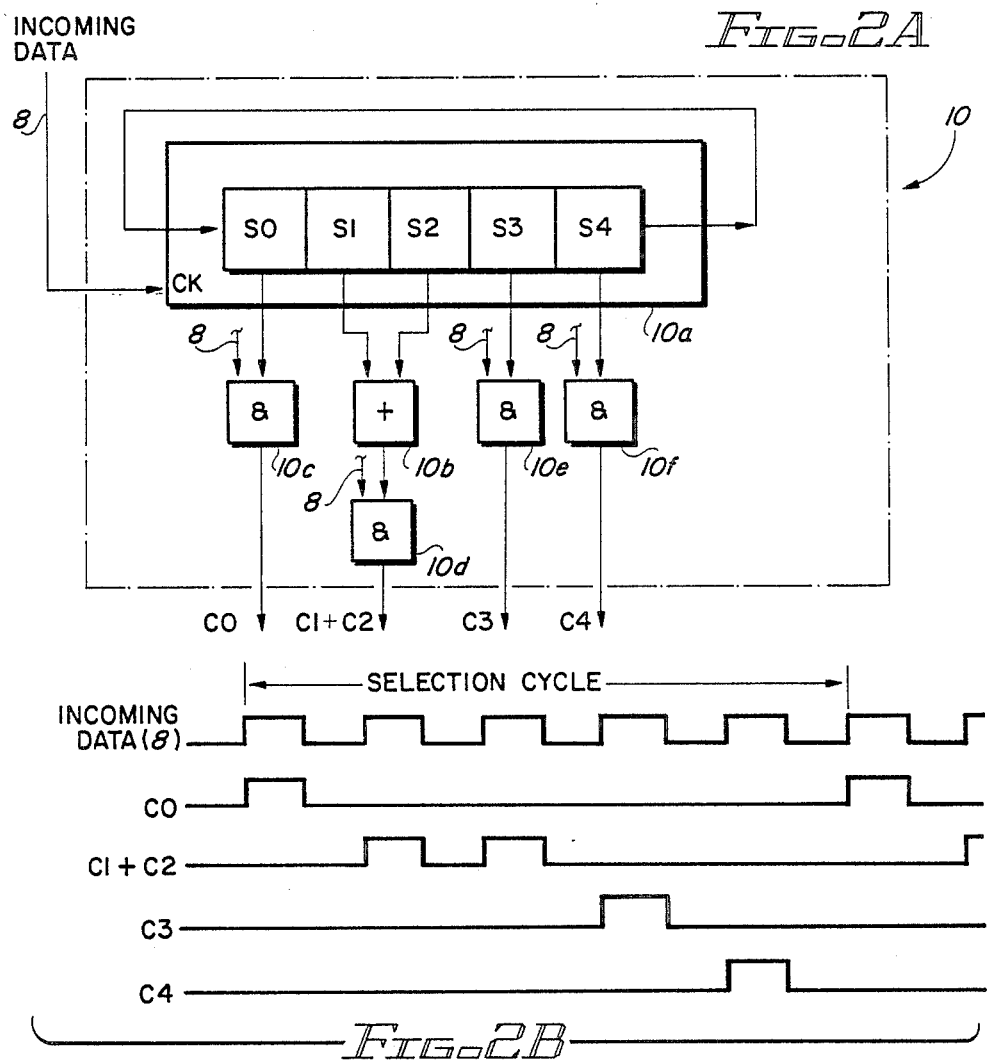
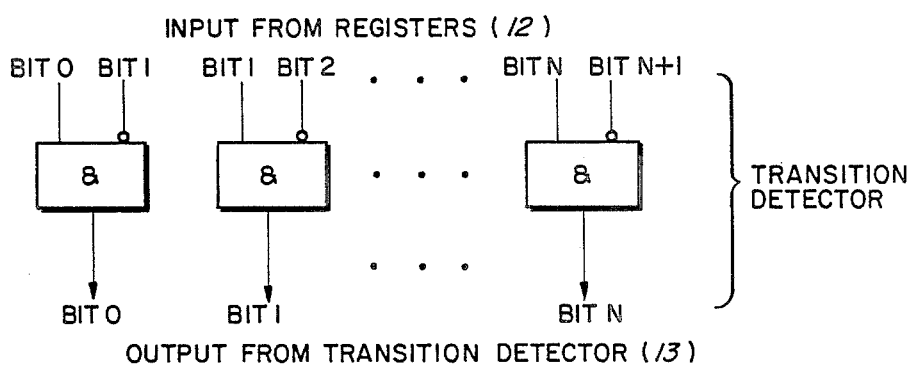

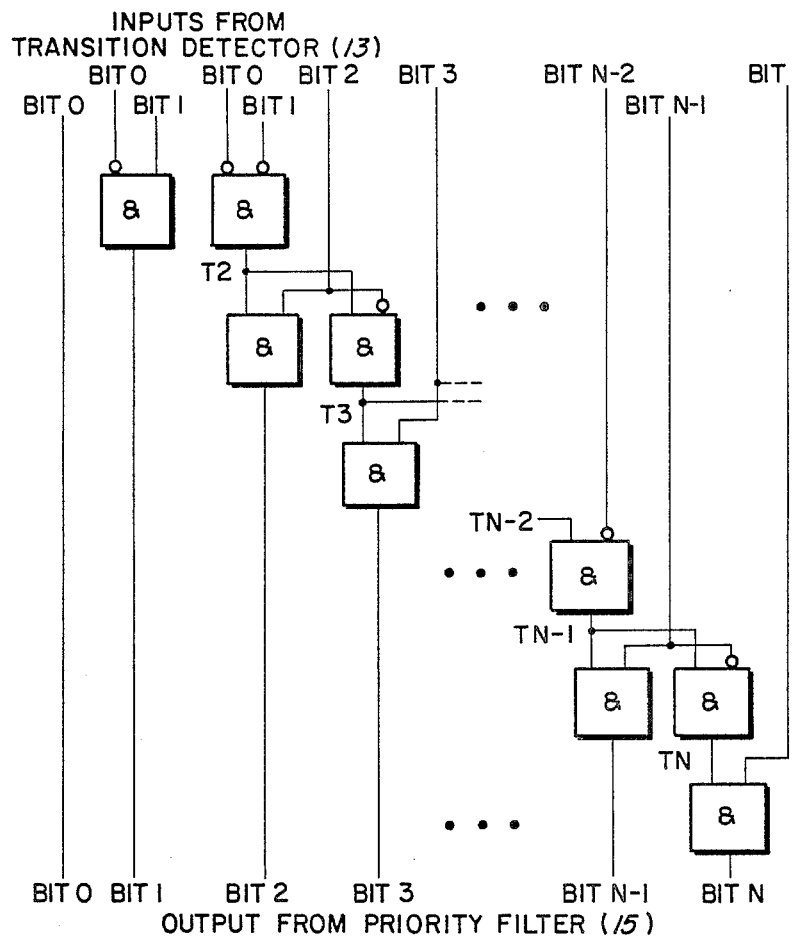

DIGITAL PHASE-LOCKED DEVICE AND METHOD

DESCRIPTION

This invention relates to a digital phase-locked device and method for synchronizing incoming data with a local clock, and more particularly to a device and method wherein the stream of data is phase locked to a local clock within a preselected number of bit transitions in the data stream and wherein during operation at different data rates, no calibration of the length of a delay element string is required to insure that the total delay time is equal to the local clock period.

BACKGROUND OF THE INVENTION

U.S. Pat. No. 4,677,648 to Zurfluh, assigned to the assignee of the present invention, discloses a digital phase-locked loop wherein a chain of delay elements implements phase offset detection and clock signal phase shifting. No sampling or control signals are used having a frequency higher than that of the local master clock. However, continual estimation is required of the number of delay elements in a delay element string that is required for a delay time equal to one period of the local clock; and a look-up table is required to correct the phase offset to a phase selection value.

In the co-pending application. U.S. Ser. No. 07/121,667 filed Nov. 17, 1987, assigned to the assignee of the present invention, a digital phase-locked correction loop is reset by subtracting one local clock cycle whenever the buildup of successive delay increments added to the system clock equals a full local clock cycle.

While these digital phase-locked devices operate satisfactorily, there is a need for a device and method which does not require any of the components required by analog or digital phase-locked loops (e.g. VCOs, frequency multipliers, phase detectors, microprocessors, comparators, etc.) There is a need for an improved device wherein phase locking of the incoming data stream to the local clock can be achieved within a preselected number of bit transitions, preferably an integral multiple of a selection cycle corresponding to the number of clock signals required to sequentially clock a register and a selection register. There is also a need for a device and method capable of operating at multiple data rates without requiring that the length of a delay element string be calibrated or recalibrated in order to insure that the total delay time will be equal to the local clock period. Finally, it is desirable that the phase-locked device be so compact and configured that it can be implemented on a VLSI chip, while at the same time retaining the feature of the above-cited prior art whereby no circuit element operates at a frequency higher than that of the local clock.

SUMMARY OF THE INVENTION

Toward this end and according to the invention, there is provided an improved digital phase-locked device and method for synchronizing incoming data with a local clock. The device includes a register which, when triggered during each successive selection cycle, traps the states of waveforms supplied by a delay element string. A transition detector detects transitions in these waveforms and provides to a selection means a plurality of outputs, each corresponding directly to a respective clock position. The selection means provides a window defining the maximum number of unique clock positions adjacent a then present clock position within which bit patterns are examined for determining whether any of the clock positions then within the window constitutes a valid local clock selection choice.

While operating in a locked condition, if a bit pattern within said window is indicative of only one local clock selection choice, that clock position is selected and locked as the local clock. If the bit pattern in the window is indicative of none or more than one local clock selection choice, then unlocking of the phase lock will be deferred until at least the next selection cycle. At any time during the deferral period, if and when the bit pattern within window SW is indicative of only one clock selection choice, that clock position will be selected and locked as the local clock; otherwise unlocking will occur at the end of the deferral period and relocking of the phase lock initiated.

During start up and during a wrap mode, a control means clears a selection register forming part of the selection means and enables a priority filter. This filter filters out from said outputs of the transition detector all but one active bit and unconditionally accepts the clock position corresponding to this single active bit as the then present clock position. However, operation during start-up and in the wrap mode differs in the following respect.

During start-up, successive single active bit outputs of the priority filter will be accepted unconditionally in sequence as the then present clock position but no locking will occur until the current output from the priority filter falls within the selection window defined by the previous output; whereupon that clock position corresponding to the current output will be selected and locked as the local clock, and operation will continue as above described for the locked condition.

In the wrap mode, however, the single active bit output of the priority filter is used only once; i.e., the clock position corresponding to the first single active bit output is unconditionally accepted and locked as the local clock; whereupon operation will continue as described for the locked condition.

BRIEF DESCRIPTION OF THE DRAWINGS

FIGS. 2A and 2B depict a clock sequence generator forming part of the device of FIG. 1 and waveforms generated thereby, respectively.

FIG. 3 depicts the logic diagram for a one-to-zero transition detector forming another part of the device of FIG. 1.

FIG. 4 depicts the logic diagram for a priority filter forming another part of the device of FIG. 1.

FIGS. 5A, 5B, 5C diagrammatically illustrate different situations which occur when various bit patterns lie within a selection window.

DESCRIPTION OF PREFERRED EMBODIMENT

Figure 1:
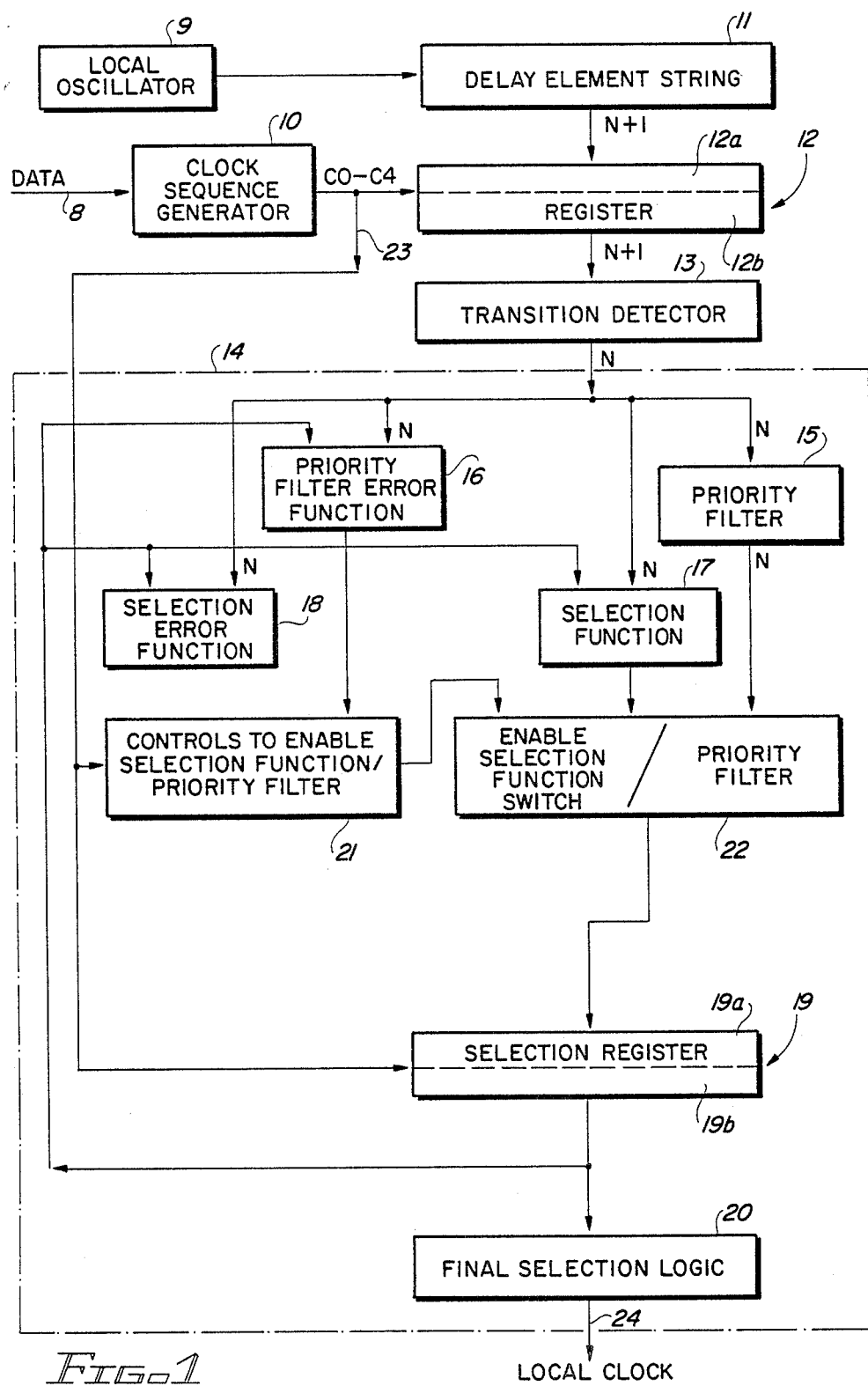
FIG. 1 is a schematic block diagram of a digital phase-lock device embodying the invention.

The digital phase-lock device embodying the invention requires only an incoming data signal and a signal from a local oscillator (such as a piezo-electric crystal) to synchronize the data with a local clock. As illustrated in FIG. 1, this device comprises, briefly, a clock sequence generator 10 which generates clock signals $C_0$–$C_4$ from an incoming data signal 8. Signals from a local oscillator 9 are fed into a delay element string 11 to generate a family of delayed clocks, each of which serves as an input to a register means 12, comprising two registers or stages 12a, 12b. Register means 12, when triggered, traps the state of the waveforms supplied by delay element string 11. A transition detector 13 detects transitions in these waveforms and provides to a selection means 14 a plurality of outputs.

Selection means 14 comprises, briefly, a priority filter 15, priority filter error function logic circuitry 16, selection function logic circuitry 17, selection error function logic circuitry 18, a selection register means 19 having two registers 19a, 19b, final selection logic circuitry 20, and control circuitry 21 to condition a switch 22 to selectively connect priority filter 15 or selection function circuitry 17 to selection register 19.

The various components will now more specifically be described. As illustrated in FIGS. 2A and 2B, clock sequence generator 10 generates five unique clock signals $C_0$–$C_4$ during each "selection cycle", which is defined as the predetermined time period required to select a new local lock. The signals $C_0$–$C_4$ are synchronized such that register 12a latches responsively to signal $C_0$, then register 12b latches responsively to signal $C_1$ and then again responsively to signal $C_2$; whereupon selection registers 19a, 19b are latched sequentially by signals $C_3$ and $C_4$, respectively, to complete the selection cycle. Thus, the registers 12a, 12b are latched alternately except that register 12b latches twice successively; this is done in order to eliminate any metastable outputs.

Mathematically, the above stated operating conditions placed on the clock signals $C_0$–$C_4$ are stated by the following equation:

$$(C_i)(C_j) = 0 \; i \neq j, \; i = 0, 1, \ldots 4, \; j = 0, 1, \ldots 4, \text{ for all } t \geq 0,$$
where t is time.

The clock sequence generator 10 comprises the digital circuitry shown in FIG. 2A to generate these clock signals. It consists of a five-bit shift register 10a which is clocked by the incoming data in line 8. Each shift register bit, $S_0$, $S_1$, $S_2$, $S_3$, and $S_4$ corresponds to one of the five clock signals $C_0$–$C_4$, which can only be active when the shift register bit is active (i.e., "1"). Since the same conditions apply to $S_0$, $S_1$, $S_2$, $S_3$, and $S_4$ as apply to the clock signals, $$(S_i)(S_j) = 0 \; i \neq j, \; i = 0, 1, \ldots 4, \; j = 0, 1, \ldots 4, \text{ for all } t \geq 0.$$

The logic circuitry in clock sequence generator 10 insures that the shift register 10a is always set so that the above conditions are met. The single successive bits of shift register 10a are then continuously cycled to produce, from the five inputs $S_0$–$S_4$, four clock signals $C_0$–$C_4$. Only four clock signals are generated because at 10b the shift register bits $S_1$ and $S_2$ are OR'd before the shift register bits, $S_0$, ($S_1$ or $S_2$), $S_3$ and $S_4$ are ANDed at 10c–10F with the incoming data. The $C_0$, ($C_1$ or $C_2$), outputs condition the registers 12a or 12b as above explained. The outputs $C_3$ and $C_4$ are fed via line 23 to condition the selection registers 19a, 19b.

The total delay time through delay element string 11 must be at least equal to one period of the local oscillator 9. So, if N is the number of selectable clock positions and N−1 constitutes one period of oscillator 9, then two extra delay elements N and N+1 are added in string 11 to insure that at least a single one-to-zero (or zero-to-one) transition can be detected by the transition detector 13, for reasons that will become apparent. Delay element string 11 generates, in well known fashion from a plurality of series-connected delay elements, a family of delayed waveforms. Each consecutive waveform is separated by the preselected delay time td between adjacent delay elements. At the end of a selection cycle, one of these delayed clocks (0–N) will be chosen as the local clock 24.

The number of bits in each register 12a, 12b is equal to N+1, the number of waveforms supplied by delay element string 11. When register 12a is triggered by the clock signal $C_0$, it traps the states of the waveforms supplied by the delay string 11. Since signal $C_0$ is generated by a data transition, the state of register 12a can be evaluated to determine the phase offset. The data in register 12a becomes available when register 12b is clocked by signal $C_1$. As earlier noted, register 12b is clocked a second time by signal $C_2$ to eliminate any metastable outputs.

Transition detector 13 (see FIG. 3) comprises combinational logic designed to detect one-to-zero transitions in registers 12a, 12b. These transitions indicate those delay clock signals which are aligned with the data. Transitions are detected from the low order (leftmost) bit to the high order (rightmost) bit. In the transition detector 13, the last bit position N+1 is lost. The highest order bit, N+1, cannot contain a transition, since there is nothing to compare it with. Thus, the output of the transition detector 13 has N bits (bit positions 0–N), one less it than the N+1 bits in registers 12a, 12b; and the total delay is at least one full period of oscillator I plus one extra bit position—the reason two extra delay elements were added as above stated. As illustrated in FIG. 3, the left bit inputs to each AND gate are non-inverted and the right bit inputs are inverted. However, if preferred, these right and left bit inputs may be reversed if it is desired that the transition detector 13 detect one-to-zero transitions. Each output from transition detector 13 corresponds directly to a respective clock position.

The various components of selection means 14 and their interaction will now be described. Priority filter 15 (see FIG. 4) filters out from the outputs of transition detector 13 every bit valued at "1" except the first bit detected in the output. (As illustrated, this is the lowest order bit, however, if preferred, it could be the highest order bit.) Thus the output of filter 15 contains only a single active (i.e., "1") bit, corresponding to a single delayed clock signal from the delay element string 11. Switch 22 is conditioned by control means 21 to enable priority filter 15 only when the phase-lock device is starting up, in a wrap mode, or relocking; otherwise, switch 22 is conditioned by control means 21 to enable the selection function. While both the priority filter 15 and selection logic 17, 18 operate continuously, only one at a time is selectively enabled. Operation under these various conditions will hereafter be described.

Selection function logic 17 has a number of outputs equal to the number of inputs supplied by transition detector 13; and each such output corresponds directly to a clock position. For example, output 5 of selection logic 17 corresponds to clock position 5. During each selection cycle, selection function logic 17 supplies the next clock selection based on the present clock selection and the inputs supplied by transition detector 13. Since only one selection output from the selection logic 17 may be active (i.e., a "1") at any one time, there can be only one clock position selected at any such time.

The selection function logic 17 is based on a "selection distance" SD which is preselected and defined as the maximum number of unique clock positions to either side of the present position which constitute a valid clock selection. For example, as illustrated in FIG. 5A, if the present clock selection is clock 5 (see bit 5), and the selection distance is 1, then clock numbers 4, 5, 6 (corresponding to bits 4, 5, 6) would be valid choices. As illustrated, then, the selection distance SD defines a "symmetric selection window" SW which has a length of three clock positions. While desirable it is not essential however, that the selection distances to the right and left of the present clock position be equal.

The bit patterns within selection window SW and the current clock selection are used to derive the equations for the selection function logic 17 and thus determine a clock selection. The number of bit patterns found within selection window SW must be less than $2^{(SW)}$, since transition detector 13 prevents the appearance of two consecutive active (i.e., "1") bits. Where SW=3 (as illustrated) or more, this number of bit patterns will be less than $2^{(SW)}$ by exclusion of all patterns where there are two or more adjacent "1" bits.

The selection equations are of two distinct types: conforming and nonconforming. The "conforming equations" have the same form, because identical bit patterns are used by these equations to select a clock. The "nonconforming equations" are confined to the 0, . . . ,SD and N−SD, . . . N positions, where SD is the selection distance and N is the highest order (or last) selectable clock position. As illustrated, then with SD=1, the nonconforming equations would apply to the 0 and 1 clock positions and the N−1 and N clock positions. These nonconforming equations occur because the bit patterns within selection window SW have special characteristics due to their endmost positions, where the bit patterns are unique and thus require equations that are unique.

The conforming equations and nonconforming equations are discussed in Appendix A.

FIGS. 5A, 5B and 5C depict three different situations that can occur when bit patterns within selection window SW are being examined. In each case, assume that the device is phase locked and that the present clock position as identified in selection register 19 is in the center of window SW (bit position 5). Note that only one selection register bit position can be active at a time. This guarantees that only one clock can be selected as the data clock.

Assume now that the output from transition detector 13 to selection register 19 is a "1" in bit position 6 and that there are "0's" in bit positions 4 and 5, as shown in FIG. 5A. Since there is only one valid choice (the single "1" bit) in window SW, the window will move rightward to bit position 6 in which the "1's" are aligned; clock position 6 will be selected and locked as the valid selection choice for local clock 24, and no error will be generated. If the sample "1" in the transition detector output had been in bit position 4, window SW will move leftward to align the "1's"; and if in bit position 5, window SW will remain stationary. During each successive selection cycle, bit pattern reexamination will be repeated.

Assume now that instead of only one "1" in window SW, the output from transition detector 13 includes "1's" in two window bit positions (e.g., 4 and 6, as illustrated in FIG. 5B) or that all bits in the window are "0's". In such event, window SW will not move, and a correctable error signal will be generated by selection error function logic circuitry 18. A correctable error is defined as one in which more than one clock selection choice (i.e., more than one "1" or no "1's") lie within selection window SW.

In the situations described in connection with FIGS. 5B and 5C (i.e., where there is more than one "1" or there is no "1" within window SW), the device will remain locked and window SW will not move until at least the next selection cycle; whereupon the bit pattern will be reexamined to see if there is now a single "1" bit in window SW indicative of a valid clock selection choice. The number of successive selection cycles during which an unlocking decision is deferred for successive errors (whether correctable, conditional or a combination of both) is preselected by the circuit designer, and may differ for the various types of errors as programmed or hardwired in the control logic circuitry 21.

Circuitry 21 preferably is provided by a so-called Moore finite state machine. This finite state circuitry 21 is clocked by sequence generator 10 and responsive to inputs from the selection error logic circuitry 18 and priority filter error logic circuitry 16, during the then present or current state, to condition switch 22 to selectively enable either the selection logic or the priority filter.

As earlier noted, selection register 19 receives data from either the priority filter 15 or the selection function logic circuitry 17. When register 19a is triggered by the clock signal $C_3$, the input data is trapped. This data, which corresponds to a clock selection choice, becomes available to selection register 19 when register 19b is triggered via line 23 by clock signal $C_4$. Then the 0, . . . ,N bits of selection register 19 are ANDed with the respective 0, . . . ,N delayed clock signals from delay element string 11. However, only one of the clock signals produced by string 11 is enabled because only one of the 0, . . . ,N selection bits will be active (i.e., a "1"). All 0, . . . ,N outputs resulting from the ANDing are OR'd together to produce a single local clock output signal in line 24.

In operation, during start up, control circuitry 21 conditions switch 22 to clear selection register 19 forming part of selection means 17, 18, 19 and enables priority filter 15. Filter 15 filters out from the outputs of transition detector 13 all but one active bit and unconditionally accepts the clock position corresponding to this single active bit as the then present clock position. Successive single active bit outputs of priority filter 15 will be accepted unconditionally in sequence as the then present clock position but no locking will occur until the current output from the priority filter falls within the selection window SW defined by the previous output; whereupon that clock position corresponding to the current output will be selected and locked as the local clock. In other words, the device will remain in start-up mode until locking is eventually achieved.

While operating in a locked mode, if a bit pattern within selection window SW is indicative of only one local clock selection choice, that clock position is selected and locked as the local clock. If the bit pattern in window SW is indicative of none or more than one local clock selection choice, then unlocking of the phase lock will be deferred until at least the next selection cycle. The number of selection cycles unlocking is deferred if no valid clock selection choice is indicated is preselected by the designer. At any time during the deferral period, if and when the bit pattern is indicative of only one clock selection choice, that clock position will be selected and locked as the local clock; otherwise unlocking will occur at the end of the deferral period and relocking of the phase lock initiated. Relocking is achieved by repeating the start-up procedure.

The single active bit in the selection register corresponding to the then current clock position is always centered in selection window SW, as shown in FIGS. 5A, B, C. If the selection window SW is moved incrementally leftward to where this single active bit is at bit position 0 (or rightward to bit position N), the wrap mode will be initiated. When in wrap mode, selection register 19 will be cleared and priority filter 15 enabled as during start-up. However, the single active bit output of priority filter 15 is used only once; i.e., the clock position corresponding to the first single active bit output is unconditionally accepted and locked as the local clock; whereupon locked operation will continue as described for the locked mode.

In the embodiment illustrated, each selection cycle consisted of five data periods. However, if preferred, this number may be increased to any desired odd number, the odd number being required to permit register 12b to latch twice successively to eliminate any metastable outputs. Also, while the data depicted in FIG. 2B has a uniform data rate, it is to be noted that the digital phase-locked device herein disclosed does not require a uniform data rate; it can be used with encoded data such as that produced by a run length limited transmission code. For use with multiple data rates, the total delay time through the delay element string 11 must, of course, be at least equal to the bit period of the slowest expected data rate.

It will be understood that the foregoing and other changes may be made in the digital phase-locked device and method herein described. The embodiment illustrated is therefore to be considered merely illustrative and the invention is not to be considered limited except as specified in the claims.

APPENDIX A

I. Selection Logic During Locked Operations

APPENDIX A

I. SELECTION LOGIC DURING LOCKED OPERATIONS

| | Conforming Equation | | |
|---|---|---|---|
| Assume as in: | FIG. 5A | FIG. 5B | FIG. 5C |
| SELECT. REG. (SR) CURRENT CHOICE | $A_{x-1}$ $A_x$ $A_{x+1}$<br>0   1   0 | $A_{x-2}$ $A_{x-1}$ $A_x$<br>0   1   0 | $A_x$ $A_{x-1}$ $A_{x-2}$<br>0   1   0 |
| TRANSIT. DET. (TD) SAMPLE | $B_{x-1}$ $B_x$ $B_{x+1}$<br>0   1   0<br>0   0   0<br>1   0   1 | $B_{x-2}$ $B_{x-1}$ $B_x$<br>0   0   1 | $B_x$ $B_{x-1}$ $B_{x+2}$<br>1   0   0 |
| TO SR NEXT CHOICE | $A_{x-1}$ $A_x$ $A_{x+1}$<br>0   1   0 | $A_{x-2}$ $A_{x+1}$ $A_x$<br>0   0   1 | $A_x$ $A_{x+1}$ $A_{x+2}$<br>1   0   0 |

If x is the current bit position choice in the selection register, and is any integer between and including 2 and $N-2$, the selection logic equation for bit position x will be:

$$SEL_x = A_x(\overline{B_{x-1} \oplus B_{x+1}}) + B_x(A_{x+1}\overline{B}_{x+2} + A_{x-1}\overline{B}_{x-2})$$

The transition detector 13 output cannot have two or more consecutive 1's; thus the following patterns 0 1 1, 1 1 0 and 1 1 1 will not be found in window SW.

Although, 0 0 0 and 1 0 1 are legitimate patterns which may occur within the window, they imply that the next choice is outside the window (0 0 0) or that there is metastability (1 0 1). Thus, they are recorded as errors and the current selection remains. Decision to unlock will be deferred at least one more selection cycle to provide opportunity to recover.

| Nonconforming Equations | | | | | | |
|---|---|---|---|---|---|---|
| Assume as below; then current choice will be held at $A_1$. | | | | Assume as below; then window will move left and give next selection cycle one more chance to correct. | | |
| SR<br>CURRENT CHOICE | $A_0$<br>0 | $A_1$<br>1 | $A_2$<br>0 | | | |
| TD<br>SAMPLE | $B_0$<br>1 | $B_1$<br>0 | $B_2$<br>0 | | | |
| TO SR<br>NEXT CHOICE | $A_0$<br>1 | $A_1$<br>0 | $A_2$<br>0 | | | |
| | $SEL_0 = A_1 B_0 \overline{B}_2$ | | | | | |
| SR | $A_0$<br>0 | $A_1$<br>1 | $A_2$<br>0 | $A_1$<br>0 | $A_2$<br>1 | $A_3$<br>0 |
| TD | $B_0$<br>0<br>0<br>1<br>0 | $B_1$<br>1<br>0<br>0<br>1 | $B_2$<br>0<br>0<br>1<br>1 | $B_1$<br>1 | $B_2$<br>0 | $B_3$<br>0 |
| CAN'T OCCUR | 1<br>1 | 1<br>1 | 0<br>1 | | | |
| SR | $A_0$<br>0 | $A_1$<br>1 | $A_2$<br>0 | $A_1$<br>1 | $A_2$<br>0 | $A_3$<br>0 |
| | $SEL_1 = A_1(\overline{B_0 \oplus B_2}) + A_2 B_1 \overline{B}_3$ | | | | | |
| Assume as below; then current choice will be held at $A_{N-1}$. | | | | Assume as below; then window will move right and give next selection cycle one more chance to correct. | | |
| SR<br>CURRENT CHOICE | $A_{N-2}$<br>0 | $A_{N-1}$<br>1 | $A_N$<br>0 | | | |
| TD<br>SAMPLE | $B_{N-2}$<br>0 | $B_{N-1}$<br>0 | $B_N$<br>1 | | | |

-continued

Nonconforming Equations

| | | | | | | |
|---|---|---|---|---|---|---|
| TO SR | $A_{N-2}$ | $A_{N-1}$ | $A_N$ | | | |
| NEXT CHOICE | 0 | 0 | 1 | | | |
| | $SEL_N = A_{N-1} B_N \overline{B_{N-2}}$ | | | | | |
| SR | $A_{N-2}$ | $A_{N-1}$ | $A_N$ | $A_{N-3}$ | $A_{N-2}$ | $A_{N-1}$ |
| | 0 | 1 | 0 | 0 | 1 | 0 |
| TD | $B_{N-2}$ | $B_{N-1}$ | $B_N$ | $B_{N-3}$ | $B_{N-2}$ | $B_{N-1}$ |
| | 0 | 1 | 0 | 0 | 0 | 1 |
| | 0 | 0 | 0 | | | |
| | 1 | 0 | 1 | | | |
| | 0 | 1 | 1 | | | |
| CAN'T OCCUR | 1 | 1 | 0 | | | |
| | 1 | 1 | 1 | | | |
| SR | $A_{N-2}$ | $A_{N-1}$ | $A_N$ | $A_1$ | $A_2$ | $A_3$ |
| | 0 | 1 | 0 | 0 | 0 | 1 |

$$SEL_{N-1} = A_{N-1}(\overline{B_N \oplus B_{N-2}}) + A_{N-2}B_{N-1}\overline{B_{N-3}}$$

II. Selection Error Function

Conforming Equation

If x is the current bit position selection choice and is any integer between and including 1 and N, the selection error function equation for position x will be:

$$SEF_x = A_x[(\overline{B_{x-1} \oplus B_{x-1}})(B_{x-1} + \overline{B_x})]$$

There is no nonconforming equation for Selection Error Function (SEF). $A_0$ cannot be in the center of window SW. If $A_0$ is the current choice, then wrap mode is initiated.

III. Priority Filter Error Function

Conforming Equation

Again, assuming that x is between an including 1 and N−1 and denotes the bit position corresponding to the current selection, and that A denotes the selection register and B denotes the transition detector, then the priority filter error function equation is:

$$PFEF = \overline{A_x}\overline{B_{x-1}}B_x B_{x+1}$$

The priority filter output can have only a single active bit. Thus, the patterns 1 0 1, 1 1 1, 0 1 1, 1 1 0, will not be found within the window.

This means that the only detectible error condition will occur if

| $B_{x-1}$ | $B_x$ | $B_{x+1}$ |
|---|---|---|
| 0 | 0 | 0 |

PFEF will equal 1, denoting error

Nonconforming Equation

This relates to the following condition

| $A_0$ | $A_1$ | | $A_{N-1}$ | $A_N$ |
|---|---|---|---|---|
| 1 | 0 | | 0 | 1 |
| $B_0$ | $B_1$ | | $B_{N-1}$ | $B_N$ |
| 0 | 0 | PFEF = 1 | 0 | 0 |
| Then PFEF = $A_0\overline{B_0}B_1$, and | | | PFEF = $A_N\overline{B_{N-1}}\overline{B_N}$ | |

Note that the priority filter output can have only a single active bit. Thus, the pattern 11 will not be found within the window. Window SW may remain in the same position or move rightward from $A_0$ or leftward from $A_N$. If x is the current bit position choice in the selection register, and is any integer between and including 1 and N−1, the priority filter error function equation will be:

$$PFEF = \overline{A_x}\overline{B_{x-1}}B_x B_{x+1} + A_0\overline{B_0}B_1 + A_N\overline{B_{N-1}}\overline{B_N}$$

What is claimed is:

1. In a digital phase-locked device for synchronizing incoming data with a local clock, the combination of:
   means for generating a family of delayed clock waveforms each separated by a preselected delay time;
   clock sequence generator means clocked by the incoming data for generating a fixed preselected plurality of clock signals during each successive selection cycle, each such cycle constituting a predetermined time period required to select a new local clock;
   means responsive to said clock signals for trapping the states of said waveforms;
   transition detector means for detector transitions in said trapped waveform and providing as outputs bit patterns that correspond directly to respective clock positions;
   selection means including means providing a selection window defining the maximum number of unique clock positions adjacent a then present clock position within which said bit patterns are examined, said selection means being operative to examine said bit patterns for the clock positions then within the window; and
   means responsive to the bit pattern within said window being indicative of only one local clock selection choice, to select and lock that clock position as the local clock.

2. The device of claim 1, wherein the last-named means is responsive to the bit pattern within said window being indicative of other than one local clock selection choice, to defer a decision to unlock the phase lock until at least the next selection cycle.

3. The device of claim 2, wherein during a preselected deferral period including the next selection cycle, the last-named means is responsive to the bit pattern within said window being indicative of only one selection choice to select and lock that clock position as the local clock and suspend the unlock decision.

4. The device of claim 2, wherein after the expiration of a preselected unlocking deferral period including the next selection cycle, the last-named means is responsive to the bit pattern within said window being indicative of other than one selection choice to initiate an unlocking of the phase lock.

5. The device of claim 1, wherein said maximum number is an equal number of unique clock positions to each side of the then present clock position.

6. A digital phase-locked device for synchronizing incoming data with a local clock comprising:
   a delay element string;
   a clock sequence generator comprising a shift register clocked by the incoming data for providing a preselected number of sequential unique clock signals during each of a series of successive selection cycles;
   register means triggered responsively to said unique clock signals to trap the states of successive delayed waveforms supplied by the delay element string;
   a transition detector for detecting transitions in the trapped waveforms and providing as outputs bit patterns that correspond directly to respective clock positions;
   selection means having a selection window defining the maximum number of said clock positions adjacent a then present clock position within which bit patterns are examined, said selection means being operative to examine said bit patterns for the clock positions then within the window; and
   means responsive to the bit pattern within said window being indicative of only one local clock selection choice, to select and lock that clock position as the local clock, otherwise operative to defer a decision to unlock the phase lock until at least the next selection cycle.

7. The device of claim 6, wherein said preselected number is an odd number greater than one and said register means comprises two registers which are alternately latched except that one of said registers is latched twice during each selection cycle by two successive unique clock signals to eliminate any metastable output.

8. The device of claim 6, wherein the incoming data is locked to the local clock within twice said preselected number of unique clock signals.

9. A method for synchronizing incoming data with a local clock, comprising the steps of:
   generating a family of equally spaced delayed clock waveforms;
   generating from the incoming data a fixed preselected plurality of clock signals during each of a series of successive selection cycles, each constituting a predetermined time period required to select a new local clock;
   responsive to said clock signals, trapping the states of said waveforms;
   detecting transitions in said trapped waveforms to provide as outputs bit patterns corresponding directly to respective clock positions;
   providing a selection window defining a selected number of said clock positions adjacent a then present clock position;
   examining said bit patterns for the clock positions then within the window; and
   when the bit pattern within said window is indicative of only one local clock selection choice, selecting and phase locking that clock position as the local clock.

10. The method of claim 9, including the further step of:
   deferring a decision to unlock the phase lock until at least the next selection cycle, when the bit pattern within said window is indicative of other than one local clock selection choice.

11. The method of claim 10, including the further step, when during a preselected unlocking deferral period including the next selection cycle the bit pattern within said window is indicative of only one selection choice, the selecting and locking that clock position as the local clock and suspending the unlock decision.

12. The method of claim 10, including the further step of unlocking the phase lock if after the expiration of a preselected unlocking deferral period including the next selection cycle, when the bit pattern within said window is indicative of other than one clock selection choice.

13. The method of claim 9, wherein when the bit pattern within said window is indicative of other than one local clock selection choice, examining bit patterns during up to a preselected number of successive selection cycles, and if a bit pattern constituting a valid local clock selection choice is not by then identified, accepting the next clock position as the then present clock position and repeating the bit pattern examination during successive selection cycles until locking is achieved.

14. A method for synchronizing incoming data with a local clock, comprising the steps, during start-up, of:
   generating a family of equally spaced delayed clock waveforms;
   generating from the incoming data a fixed preselected plurality of clock signals during each of a series of successive selection cycles, each constituting a predetermined time period required to select a new local clock;
   responsive to said clock signals, trapping the states of said waveforms;
   detecting transitions in trapped waveforms supplied by a delay element string and providing as outputs bit patterns corresponding directly to respective clock positions;
   filtering out from said bit patterns all but one active bit and accepting as the present clock selection the clock position corresponding to this single active bit;
   examining said bit patterns within a selection window constituting a maximum number of said clock positions adjacent the then present clock position;
   repeating the filtering and accepting steps for each subsequent active bit in each subsequent one of said bit patterns successively until the then current bit falls within the selection window; and
   then selecting and locking that clock position corresponding to said current bit as the local clock.

15. A method for synchronizing incoming data with a local clock, comprising the steps, during operation in a wrap mode, of:
   using a clock sequence generator clocked by the incoming data, trapping in a register a preselected fixed number of waveforms constituting delayed replicas of incoming clock signals supplied by a delay element string;
   detecting transitions in the trapped waveforms and providing as outputs bit patterns corresponding directly to respective clock positions;
   filtering out, from those of said bit patterns then within a selection window, all but the first active bit detected and unconditionally accepting the clock position corresponding to this single active bit as the then present clock position; and locking said unconditionally accepted clock position as the local clock.

16. In a digital phase-locked device for synchronizing incoming data with a local clock during wrap mode, said device including a register which, when triggered during each successive selection cycle, traps the states of waveforms supplied by a delay element string, the combination of:
 a transition detector for detecting transitions in the trapped waveforms and providing as outputs bit patterns corresponding directly to respective clock positions then within a selection window;
 a priority filter;
 control means including means, operative during start-up and in a wrap mode, for bit patterns all but the first active bit and unconditionally accepting the clock position corresponding to this single active bit as the present local clock.

* * * * *